United States Patent
Chao et al.

Patent Number: 5,629,221
Date of Patent: May 13, 1997

[54] PROCESS FOR SUPPRESSING BORON PENETRATION IN $BF_2^+$-IMPLANTED $P^+$-POLY-SI GATE USING INDUCTIVELY-COUPLED NITROGEN PLASMA

[75] Inventors: Tien S. Chao; Chih-Hsun Chu, both of Hsinchu, Taiwan

[73] Assignee: National Science Council of Republic of China, Taipei, Taiwan

[21] Appl. No.: 562,465

[22] Filed: Nov. 24, 1995

[51] Int. Cl.⁶ .................................... H01L 21/265
[52] U.S. Cl. .................. 438/591; 257/411; 438/515; 438/762; 438/923
[58] Field of Search ................ 437/18, 40, 34, 437/41, 242, 46; 257/411

[56] References Cited

U.S. PATENT DOCUMENTS

| | | | |
|---|---|---|---|
| 3,793,090 | 2/1974 | Barile et al. | 257/411 |
| 4,623,912 | 11/1986 | Chang et al. | 257/411 |
| 5,032,545 | 7/1991 | Doan et al. | 437/242 |
| 5,219,773 | 6/1993 | Dunn | 257/411 |
| 5,369,297 | 11/1994 | Kusunoki et al. | 257/411 |
| 5,407,870 | 4/1995 | Okada et al. | 257/411 |
| 5,478,765 | 12/1995 | Kwong et al. | 437/242 |
| 5,504,021 | 4/1996 | Hong et al. | 437/242 |

FOREIGN PATENT DOCUMENTS

| | | | |
|---|---|---|---|
| 0187035 | 7/1990 | Japan | 437/18 |
| 403265131 | 11/1991 | Japan | 437/18 |

*Primary Examiner*—John Niebling
*Assistant Examiner*—Long Pham
*Attorney, Agent, or Firm*—Bacon & Thomas

[57] ABSTRACT

A process for suppressing boron penetration in $BF_2^+$-implanted $P^+$-poly-Si gates provides a nitrided layer between the oxide layer and poly-Si through use of inductively-coupled nitrogen plasma (ICNP) to form an energy barrier which the boron ion can hardly penetrate. The process includes the steps of growing an oxide layer by washing the silicon, introducing nitrogen gas into the inductively-coupled plasma (ICP) system and carrying out nitrogen plasma surface treatment at RF power of 150w to 250w; stacking polysilicon of 3000 Å low pressure chemical vapor deposition (LPCVD) system; implanting $BF_2^+$ at $5\times10^{15}$ atom/cm² and 50 KeV; removing the surface oxide layer by annealing at 900° C. for a time; and plating Al to form a MOS capacitor and measuring electric properties.

2 Claims, 4 Drawing Sheets

PROCESS FOR SUPPRESSING BORON PENETRATION IN BF$_2$$^+$-IMPLANTED P$^+$-POLY-SI GATE USING INDUCTIVELY-COUPLED NITROGEN PLASMA

BACKGROUND OF THE INVENTION

P$^+$ -Poly -Si has been proposed and recommended as the gate material for surface-channel pMOSFETs in deep submicron CMOS (complementary metal-oxide semiconductor) structures [1]. This is because surface-channel pMOSFETs with P$^+$ -poly-Si gates can improve short-channel and sub-threshold I-V characteristics, and better controllability of the threshold voltage compared with buried-channel pMOSFETs with n$^+$ -poly-Si gates [2–4].

However, the fast diffusion of boron in poly-Si and within the gate oxide results in the easy penetration of boron through the gate to the underlying silicon substrate [5,6]. The presence of F due to BF$_2$ implantation enhances the diffusion of B [7,8]. Boron penetration results in instabilities in the device performance, such as positive shifts in the threshold voltage, increases in sub-threshold swing, increases in electron trapping, decreases in low-field hole mobility, and degradation of drive current due to poly-Si depletion in pMOSFETs.

Many methods have been proposed to suppress boron penetration [9–19]. Following the diffusion path of boron diffusion, the first way is to retard the boron diffusion inside the poly-Si. To this end, stacked or modified structures of the poly-Si gate have been proposed [9–10]. The native oxide between the stacked layers acts as the trapping center of F, consequently retarding the enhancement of B diffusion. The stacked structure also exhibits discontinuous poly-Si grain boundaries which disrupt the diffusion path of boron. Nitridation of the stacked poly-Si interface[11], or co-implantation with N, or P is also effective to retard the boron diffusion [12–13]. Utilizing a top oxide on poly-Si to getter the F has also been reported to retard the boron diffusion [14].

The second way is to establish a diffusion barrier at the interface of the poly-Si and oxide. NH$_3$ nitridation on the gate oxide is feasible [15]. However, the H atom residues during the NH$_3$ nitridation reduces the resistance to hot carrier stressing. Usually, this method needs an additional reoxidation process to reduce the H atom. Hence, the NH$_3$ nitridation process is too complex to implement in a real production line and a nitridation process on the oxide surface without H incorporation is worthy of development.

The third way to establish a diffusion barrier at the interface of the poly-Si and oxide is to build a diffusion barrier in the oxide or between the oxide and silicon substrate interface. This can be achieved by nitriding the gate oxide using N O, N$_2$O oxidation/annealing[16–19]. In this invention, a novel and simple process to built the diffusion barrier between the poly-Si and oxide was developed by using inductively-coupled nitrogen plasma (ICNP).

SUMMARY OF THE INVENTION

It is accordingly an object of the invention is to provide a process for suppressing the penetrating effect of boron ions.

This object of effectively preventing penetration of boron ions at high temperature is achieved by inductively-coupled nitrogen plasma treatment, the nitrogen plasma being introduced by an inductively-coupled method using an RF generator after growth of the gate oxide layer.

The process of the invention thus comprises providing a nitride layer between the oxide layer and polysilicon layer, which nitride layer can act as an energy barrier which is hardly penetrable by the boron ion. The advantages of the invention process are that it is very economical—N$_2$ is cheaper than NH$_3$ and N$_2$O and the system is also simpler—, the process temperature is low, the process is simple, uses low cost equipment and does not need any expensive special gas. Therefore, the practicability of the process according to the invention is very high.

DETAILED DESCRIPTION OF THE PREFERRED EMBODIMENT

Figure 1:
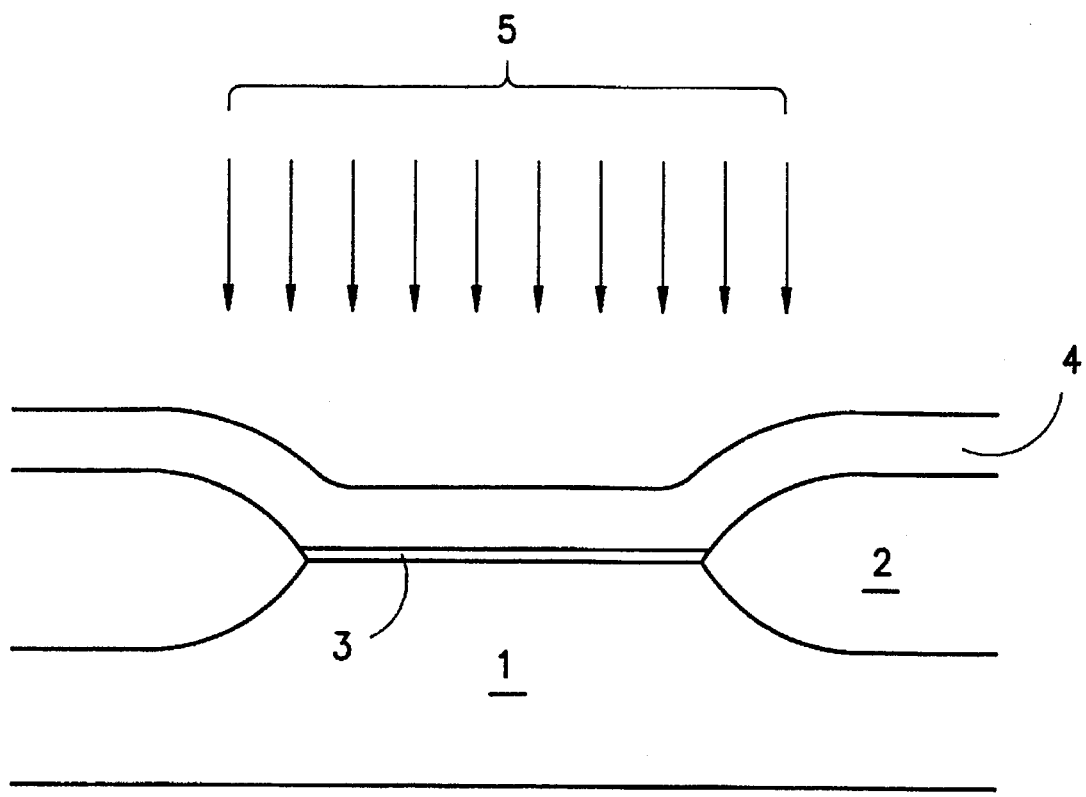
FIG. 1 illustrates the various structures made by the preferred process.

The preferred process, as illustrated in FIG. 1, is implemented as follows:

Substrate 1 and thick oxide 2 are formed from a silicon wafer according to conventional CMOS production methods. The silicon wafer is then washed and placed in a high temperature furnace, where an oxide layer 3 of 50–120 Å is grown by introducing oxygen at 900°–1000° C., again according to conventional production methods. Next, a nitrided barrier layer is formed by placing the silicon wafer in an ICNP system and introducing nitrogen at power of 100–300 W for 1–30 minutes at the surface of the substrate, after which one or more layers 4 of polysilicon or polycrystalline silicon of approximately 1000–3000 Å thickness are stacked, BF$_2$$^+$ ions 5 are implanted at an energy of 30–70 KeV and amount of 1×10$^{15}$–1×10$^{16}$ atom/cm2 with layer 3 preventing penetration, and the silicon wafer is washed again and placed into a high temperature furnace again, at which time nitrogen or oxygen is introduced at 800°–1000° C. and annealed for 10–30 minutes. Subsequent steps are the same as those in conventional double gate CMOS production.

Figure 2:
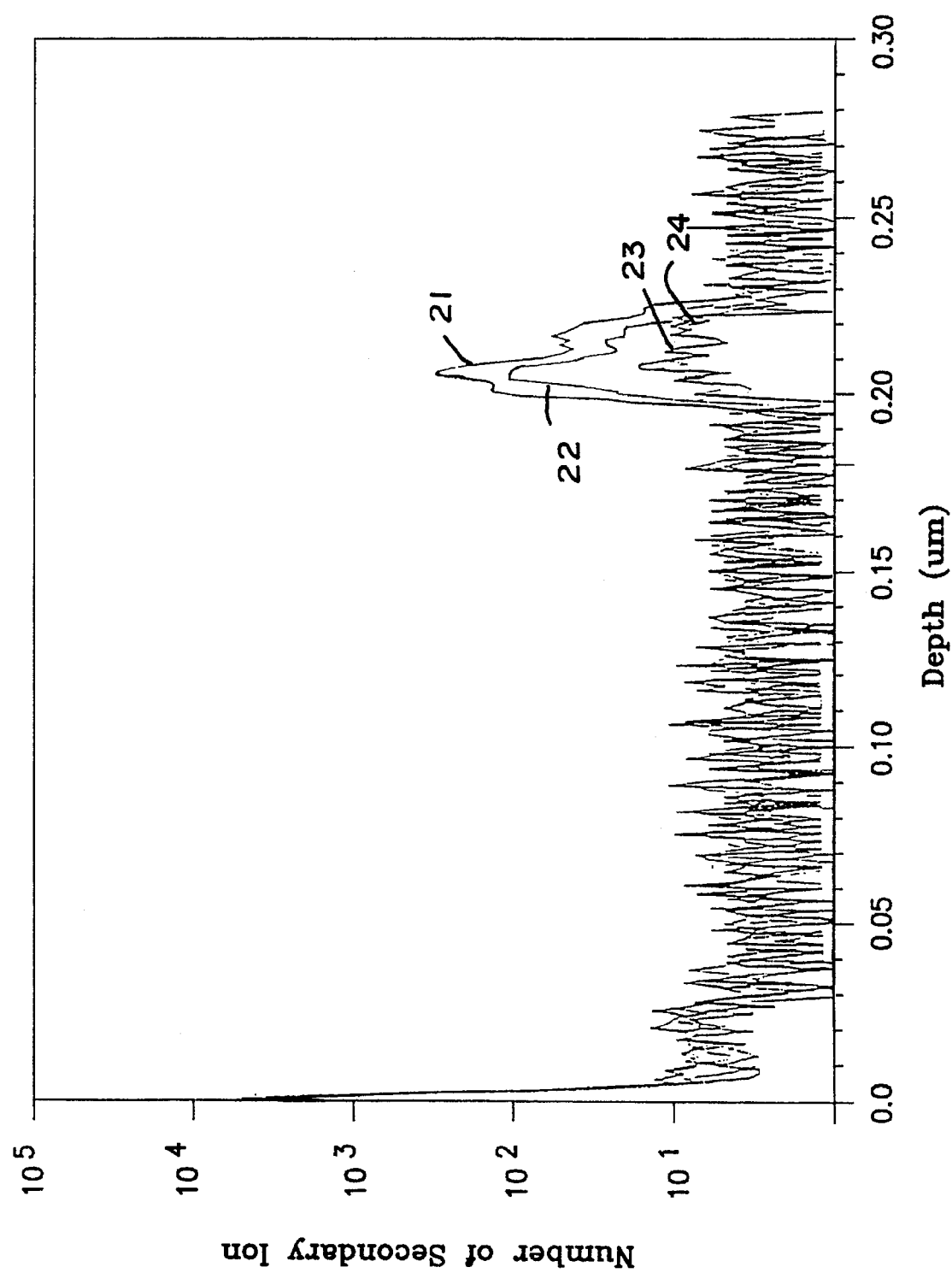
FIG. 2 is a diagram showing comparison of nitrogen content in the space between the oxide layer and the polysilicon substrate after various ICNP (inductively-coupled nitrogen plasma) treatments.

Referring to FIG. 2, a comparison of nitrogen contents in the space between the oxide layer formed and the polysilicon substrate after various ICNP treatments shows that after ICNP treatment, more nitrogen was stacked in the space between the oxide layer formed and the polysilicon substrate, the nitrogen content at 500W, 21, being higher than that at 250W, 22, whereas when the sample at 250W was annealed in high temperature nitrogen of 900° C., its nitrogen content, 23, became less and about the same as that of control sample, 24. Thus, this secondary-ion mass spectrum (SIMS) can demonstrate that a layer of nitrogen atoms is indeed formed at the interface between the oxide layer and the polysilicon substrate.

Figure 3:
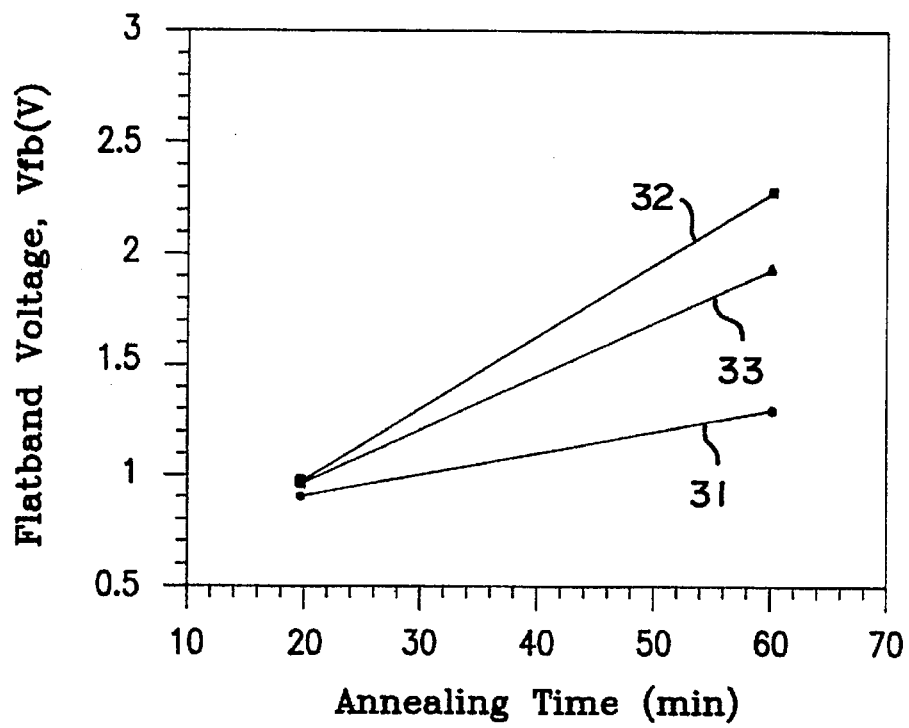
FIG. 3 is a diagram showing flatband voltages of annealed samples (at 900° C.) which have been treated at ICNP 150W for 10 min., ICNP 250W for 10 min. and without ICNP treatment.

Referring to FIG. 3, the flatband voltage (vfb) of annealed (900° C.) samples which have been treated, respectively, with ICP 150W for 10 minutes, ICP 250W for 10 minutes, and without ICP, after treatment for 20 minutes, the vfb of the sample treated with ICP 150W, 31, is the lowest, while that of the sample treated with ICP 250W, 32, is the same as that of control, 33, and after annealing for 60 minutes, the vfb of the sample treated with ICP 150W, 31, is still the lowest, but in this case, the vfb of the sample treated with ICP 250W, 32, is higher than that of control, 33.

Figure 4:
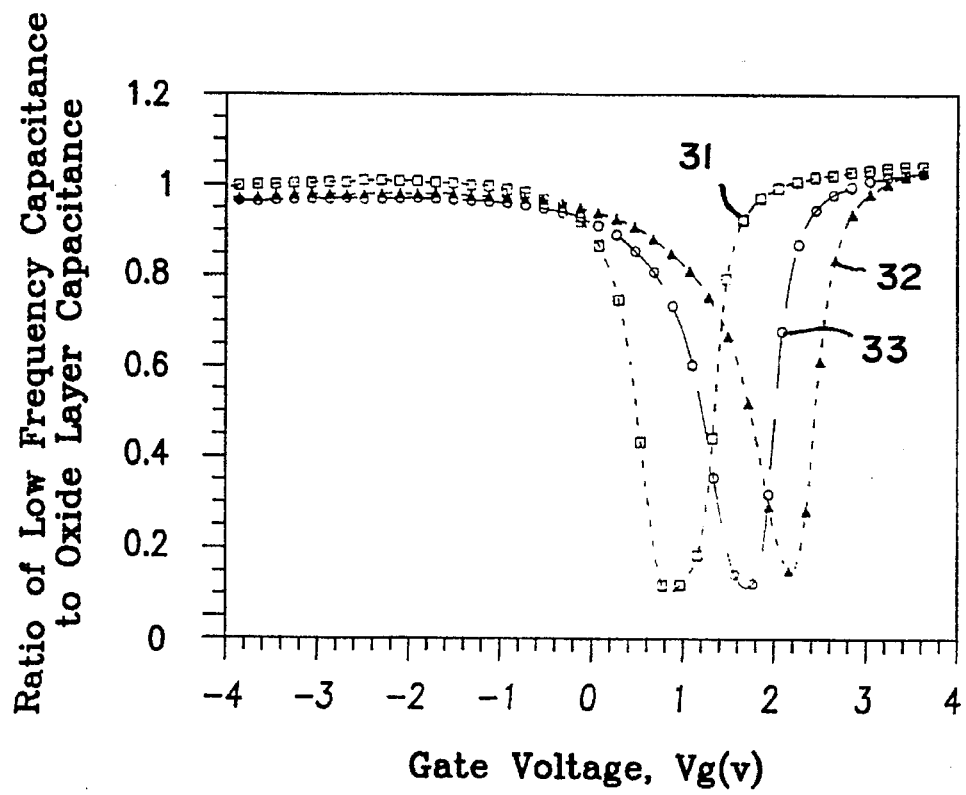
FIG. 4 is a diagram showing the relationship of the ratio of low frequency capacitance to oxide layer capacitance with the gate voltage of different samples which have been treated with ICNP 150W for 10 min., ICP 250W for 10 min. and without ICNP treatment.
Figure 5:
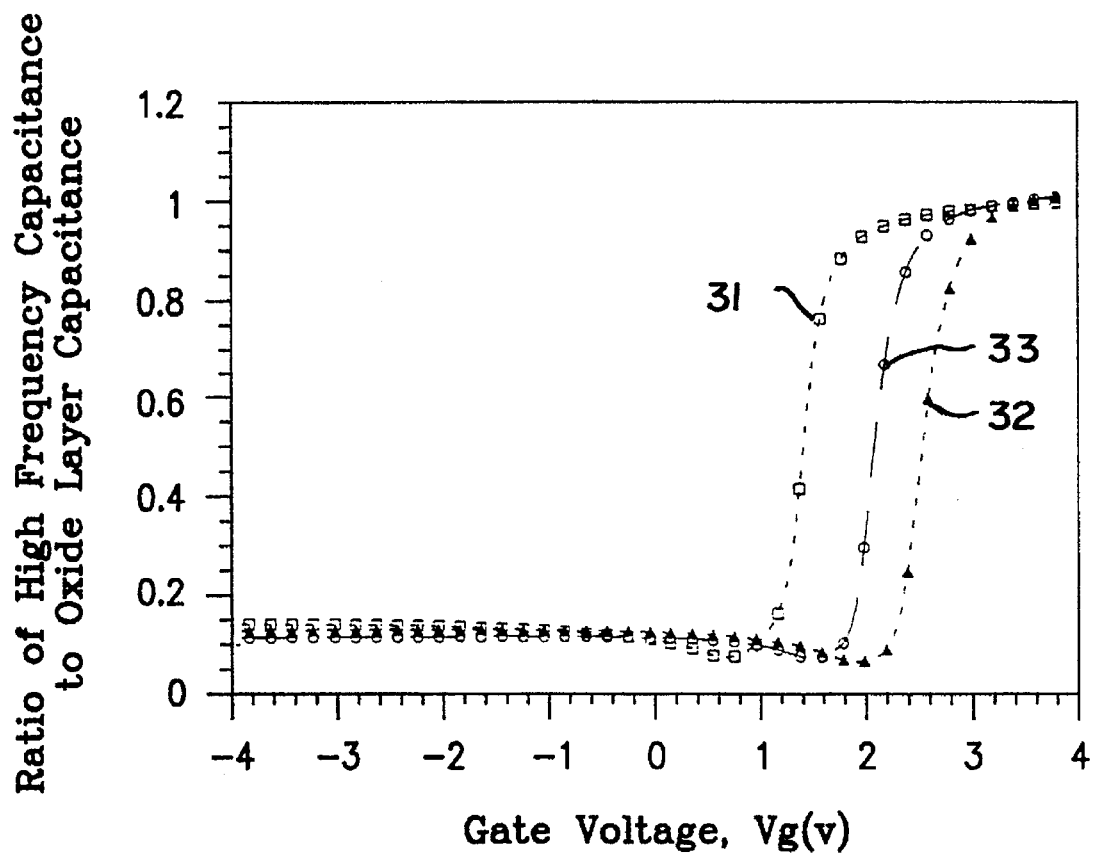
FIG. 5 is a diagram showing the relationship of the ratio of high frequency capacitance to oxide layer capacitance with the gate voltage of different samples which have been treated with ICNP 150W for 10 min., ICNP 250W for 10 min. and without ICNP treatment.

This result occurs because the power of ICP 250W is too strong, causing the quality of the oxide layer to be degraded so as to be unable to prevent the diffusion of boron ions. FIG. 4 shows the relationship of the ratio of low frequency capacitance to oxide layer capacitance versus gate voltage of those three samples after annealing at 900° C. for 60 minutes, while FIG. 5 shows their high frequency capacitance-voltage relationship. It can be seen that the shift of the sample treated with ICP 150W, 31, like its Vfb, is the lowest, indicating that its boron diffusion is the lowest.

The invention has been described in detail with reference to the above embodiments in order to illustrate the objects, features and functionalities thereof. However, a person having ordinary skill in the art will readily recognize that, according to the above description of the invention, partial variations and modifications to the embodiment can be made without departing from the scope and spirit of the invention. Accordingly, the intellectual property rights to this invention are defined only by the appended claims.

REFERENCES

[1]. G. J. Hu, and R. H. Bruce, "Design Tradeoffs Between Surface and Buried-Channel FET's," IEEE Trans. Electron Devices, ED-32, p. 584, 1985.

[2]. S. Y. Chiang, K. M. Cham, and R. D. Rung, "Optimization of Sub-Micron p-Channel FET Structure," IEDM Tech. Dig., p. 534, 1983.

[3]. K. Tanaka, and M. Fukuma, "Design Methodology for Deep Submicron CMOS," in IEDM Tech. Dig., p. 628,1987.

[4]. W. H. Chang, B. Davari, M. R. Wordeman, Y. Taur, C. C. -H.Hsu, and M.D. Rodriguze, "A High Performance 0.25 mm CMOS Technology: I-Design and Characterization," IEEE Trans. Electron Devices, ED-39,959,1992.

[5]. C. Y. Wong, J. T. -C. Sun, Y. Taur, C. S. Oh, R. Angelucci, and B. Davari, "Doping of n+ and p+ Polysilicon in a Dual-Gate CMOS Process," in IEDM Tech. Dig., p. 238,1988.

[6]. C. Y. Lu, J. M. Sung, H. C. Kirsch, S. I. Hillenius, T. E. Smith, and L. Manchanda, "Anomalous C-V Characterization of implanted Poly CMOS Structure in n+/p+ Dual-Gate CMOS Technology," IEEE Electron Device Lett., EDL-10, 192,1989.

[7]. H. -H, Tseng, P. J. Tohin, F. k. Baker, J. R. Pfiester, K. Evans, and P. L. Fejes, "The Effect of Silicon Gate Microstructure and Gate Oxide Process on Threshold Voltage Instabilities in p+-Gate p-Channel MOSFET's with Fluorine Incorporation," IEEE Trans. Electron Devices, ED-39, 1687, 1992.

[8]. J. J. Sung, C. Y. Lu, "A Comprehensive Study on p+-polysilicon Gate MOSFET's Instability with Fluorine Incorporation," IEEE Trans. Electron Devices, ED-37,2313, 1990.

[9]. S. L. Wu, C. L. Lee, and T. F. Lei, "Suppression of Boron Penetration into an Ultra-Thin Gate Oxide (<7 nm) by Using a Stacked-Amorphous-Silicon (SAS) Film," IEDM Tech. Dig., p. 329,1993.

[10]. M. Koda, Y. Shida, J. Kawaguchi, and Y. Kaneko, "Improving Gate Oxide Integrity in p+-pMOSFET by Using Large Grain Size Polysilicon Gate," IEDM Tech. Dig., p. 471,1993.

[11]. Y. H. Lin, C. S. Lai, C. L. Lee, T. F. Lei, and T. S. Chao, "Nitridation of the Stacked Poly-Si Gate to Suppress the Boron Penetration in PMOS," IEEE Electron Device Lett., EDL-16,248, 1995.

[12]. S. H. Chen, C. J. Lin, W. T. Sun, T. S. Chao, C. C. -H. Hsu, "Process Optimization for Preventing Boron-Penetration Using Phosphorous Co-Implant in p-PolyGate of P-MOSFET's," 1995 International Symposium on VLSI Technology, System, and Application, A4, May, 1995.

[13]. B. T. Kuroi, S. Kusunoki, M. Shirahata, Y. Okumura, M. Kobayashi, M. Inuishi, and N. Tsubouehi, "The Effects of Nitrogen Implantation Into P+-Poly-Silicon Gate on Gate Oxide Properties," 1994 Symposium on VLSI Technology, p. 107, Honolulu, 1994.

[14]. Y. H. Lin, C. L. Lee, T. F. Lei, and T. S. Chao, "Thin Polyoxide on the Top Poly-Si Gate to Suppress Boron Penetration for pMOS," IEEE Electron Device Lett., EDL-16, 164, 1995.

[15]. T. Hori, H. Iwasaki, and K. Tsuji, "Electrical and Physical Properties of Ultrathin Reoxidized Nitrided Oxides Prepared by Rapid Thermal Processing," IEEE Trans. Electron Dev., ED-36,340,1989.

[16]. G. Q. Lo, and D. L. Kwong, "The Use of Ultrathin Reoxidized Nitrided Gate Oxide for Suppression of Boron Penetration in BF2+-Implanted Polysilicon Gated-pMOSFET's," IEEE Electron Device Lett, EDL-12, 175,1991.

[17]. T. Hori, H. Iwasaki, "Ultra-thin Re-oxidation Nitrided-Oxides Prepared by Rapid Thermal Processing," IEDM Tech. Dig., p. 570,1987.

[18]. H. S. Momose, T. Morimoto, Y. Ozawa, M. Tsuchiaki, M. Ono, K. Yamabe, and H. Iwai, "Very Lightly Nitrided Oxide Gate MOSFETs for Deep-submicron CMOS Devices," IEDM Tech. Dig., p. 359.1991.

[19]. L. K. Han, D. Wristers, J. Yan, M. Bhat, and D. L. Kwong, "Highly Suppressed Boron Penetration in NO-Nitrided SiO2 for P+-Poly Silicon Gated MOS Device Applications," IEEE Electron Device Lett., 16,319,1995.

What is claimed is:

1. A process for suppressing boron penetration through a $BF_2+$ implanted p+ type polycrystalline Si gate region using an inductively coupled nitrogen plasma, said process comprising (a) growing a gate oxide layer on a silicon wafer substrate by steps of washing said silicon wafer, placing said substrate in a high temperature furnace, and introducing oxygen at temperatures of 900°–1000° C. to grow said oxide layer of 50–120 Å thickness;

(b) carrying out an inductively coupled plasma treatment of said silicon wafer in nitrogen at a power of 100–300 W for 1–30 minutes to form a nitrided layer on said oxide layer providing an energy barrier substantially impenetrable by boron ions;

(c) forming at least one layer of polycrystalline silicon of approximately 1000–3000 Å thickness on said nitrided layer and said oxide layer;

(d) implanting $BF_2+$ ions at an energy of 30–70 keV in an amount of $1\times10^{15}$ to $1\times10^{16}$ atoms/cm$^2$ into said at least one layer of polycrystalline silicon to form a p+ type gate region;

(e) washing said silicon wafer again; and (f) again placing said silicon wafer into said high temperature furnace, introducing one of nitrogen or oxygen at 800° to 1000° C., and annealing for 10–60 minutes.

2. A process according to claim 3, wherein said step (b) is carried out at a power of about 150 W for about 10 minutes, and said step (f) is carried out to anneal at about 900° C. for about 60 minutes.

* * * * *